(12) United States Patent
Andoh et al.

(10) Patent No.: US 6,991,943 B2
(45) Date of Patent: Jan. 31, 2006

(54) PROCESS FOR PREPARATION OF SEMICONDUCTOR WAFER SURFACE

(75) Inventors: Kohji Andoh, El Segundo, CA (US); Davide Chiola, Marina del Rey, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/728,482

(22) Filed: Dec. 4, 2003

(65) Prior Publication Data
US 2005/0124085 A1 Jun. 9, 2005

(51) Int. Cl.
*H01L 21/00* (2006.01)

(52) U.S. Cl. .......................... 438/10; 438/11; 438/101

(58) Field of Classification Search ................ 438/149, 438/174–176, 186, 194, 246–249, 466, 468, 438/473, 474, 476, 477, 480, 481, 510, 10–18, 438/974, 50, 67, 76–78, 100–101, 128–129, 438/131, 139, 142, 144, 146, 511, 517–519, 438/526–527, 919, 529–530, 961, 542–543, 438/977, 546, 549, 558, 560, 914, 918; 257/408, 257/255
See application file for complete search history.

(56) References Cited

U.S. PATENT DOCUMENTS

| | | | | |
|---|---|---|---|---|
| 5,150,042 A | * | 9/1992 | Look et al. | 324/765 |
| 5,779,922 A | * | 7/1998 | Boon et al. | 216/16 |
| 5,797,114 A | * | 8/1998 | Roberts et al. | 702/57 |
| 5,840,616 A | * | 11/1998 | Sakaguchi et al. | 438/459 |
| 5,882,953 A | * | 3/1999 | Tu et al. | 438/101 |
| 6,093,951 A | * | 7/2000 | Burr | 257/408 |
| 6,199,484 B1 | * | 3/2001 | Martinez-Tovar et al. | 102/202.4 |
| 6,206,961 B1 | * | 3/2001 | Takeno et al. | 117/20 |
| 6,245,161 B1 | * | 6/2001 | Henley et al. | 148/33.4 |
| 6,407,558 B2 | * | 6/2002 | Shabde et al. | 324/750 |
| 2004/0128631 A1 | * | 7/2004 | Ditzel et al. | 716/2 |

* cited by examiner

*Primary Examiner*—Michael Lebentritt
*Assistant Examiner*—Andre' Stevenson
(74) *Attorney, Agent, or Firm*—Ostrolenk, Faber, Gerb & Soffen, LLP

(57) ABSTRACT

A method for adjusting the resistivity in the surface of a semiconductive substrate including selective measurement and counter-doping of areas on a major surface of a semiconductive substrate.

8 Claims, 2 Drawing Sheets

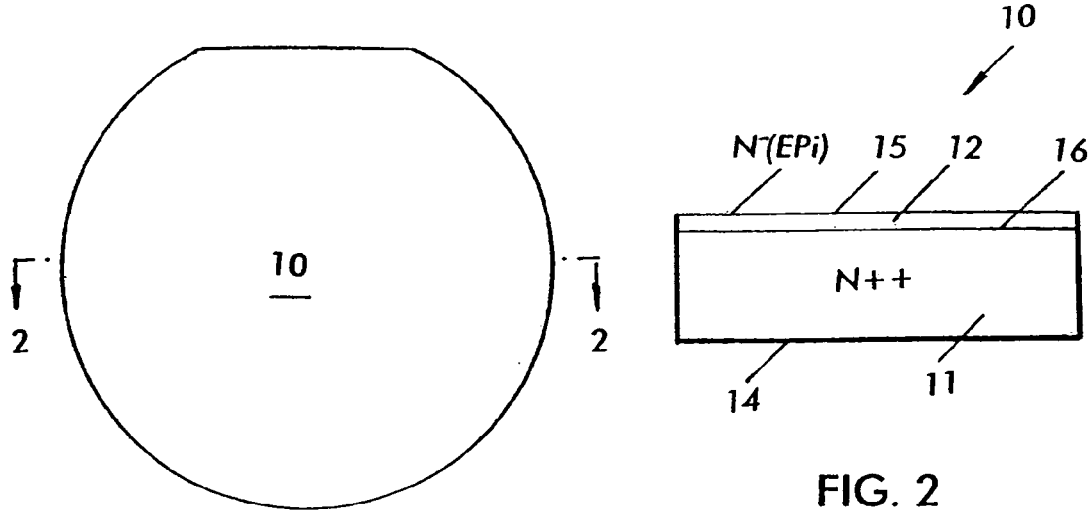
FIG. 1
FIG. 2
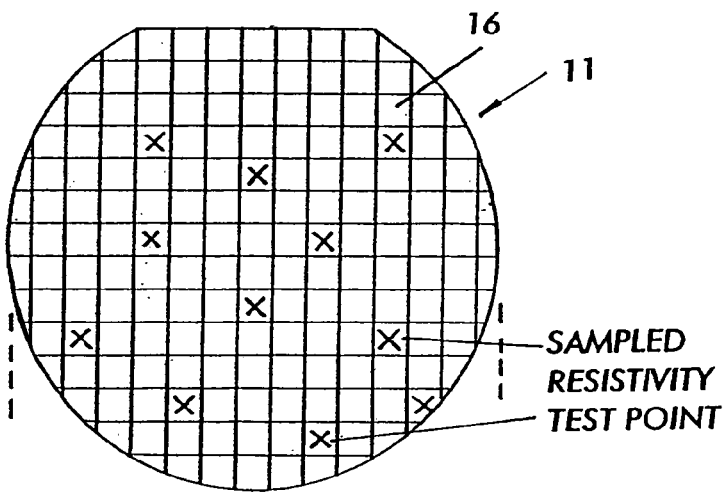
FIG. 3a
FIG. 3b

PROCESS FOR PREPARATION OF SEMICONDUCTOR WAFER SURFACE

FIELD OF THE INVENTION

This invention relates to semiconductor substrates and more specifically to the treatment of semiconductor substrates.

BACKGROUND OF THE INVENTION

Semiconductor devices such as transistors, diodes, thyristors, integrated circuits and the like are commonly made by the simultaneous processing of many identical discrete devices or integrated circuits in a common wafer.

A conventional wafer typically includes a semiconductive substrate. The substrate of a conventional wafer has a relatively high concentration of dopants (N or P), and correspondingly low resistivity. The surface resistivity across the top surface of such conventional substrates, however, is variable due in large part to the process used in the making of the ingots from which the substrates are obtained.

Semiconductor devices are typically formed on the top surface of a wafer. Generally, it is desirable to have uniform resistivity over the top surface of the wafer so that the devices formed in the wafer will exhibit substantially similar behavior. Typically, a layer of semiconductive material is epitaxially grown atop a surface of a substrate to obtain a semiconductive layer with uniform resistivity. The layer formed by epitaxial growth is conventionally referred to as an epitaxial layer or an epi layer. Epitaxial growth allows for better control of dopant concentration along the thickness of the epi layer, and thus better control over the resistivity of the epi layer.

There are substantial costs associated with epitaxial growth which increase the cost of the semiconductor devices.

It would, therefore, be desirable to eliminate the epi layer and still obtain a wafer that exhibits uniform resistivity on a top surface thereof in order to reduce the cost of semiconductor devices.

BRIEF DESCRIPTION OF THE INVENTION

In accordance with the invention, the resistivity across the upper surface of a conventional substrate is mapped by a suitable non-contact resistivity measuring technique. The resistivity map is then used to obtain a substantially uniform resistivity profile across the top surface of the substrate. Specifically, the resistivity of the substrate is locally adjusted (area by area) based on the resistivity map by counter-doping to obtain a uniform resistivity across the top surface of the substrate. The counter-doping can be carried out by an implanter which is controlled to counter-dope each selected area to a given target net concentration or resistivity to have a desired uniform resistivity over the full surface of the substrate. The implanted dopants are then diffused into the wafer surface for a desired depth.

In a preferred embodiment, a major surface of a conventional silicon substrate having an $N^{++}$ resistivity of about 3 milliohm centimeters is selectively counter-doped over its full area by a controlled boron implant which, when diffused to its final depth (of about 2 to 3 microns), will have a net $N^-$ surface resistivity of about 0.5 ohm cm. According to the present invention, the implant dose will vary over the surface of the substrate so that the final resistivity after the implant is substantially uniform over the major surface of the substrate.

According to another aspect of the invention, the resistivity of the substrate can be lowered in the ingot (from which the substrate is obtained) to, for example, about 10 milliohm centimeters so that less counter doping is needed to adjust the surface resistivity to a substantially uniform value.

BRIEF DESCRIPTION OF THE DRAWINGS

FIG. 1 is a plan view of a typical wafer according to the prior art.

FIG. 2 is a cross-section of FIG. 1 taken across section line 2—2 in FIG. 1 viewed in the direction of the arrows.

FIG. 3a is a top view of a substrate that is modified according to the present invention.

FIG. 3b shows the variation of surface resistivity at the surface and across a major diameter of the substrate of FIG. 3a.

DETAILED DESCRIPTION OF THE INVENTION

Figure 4:
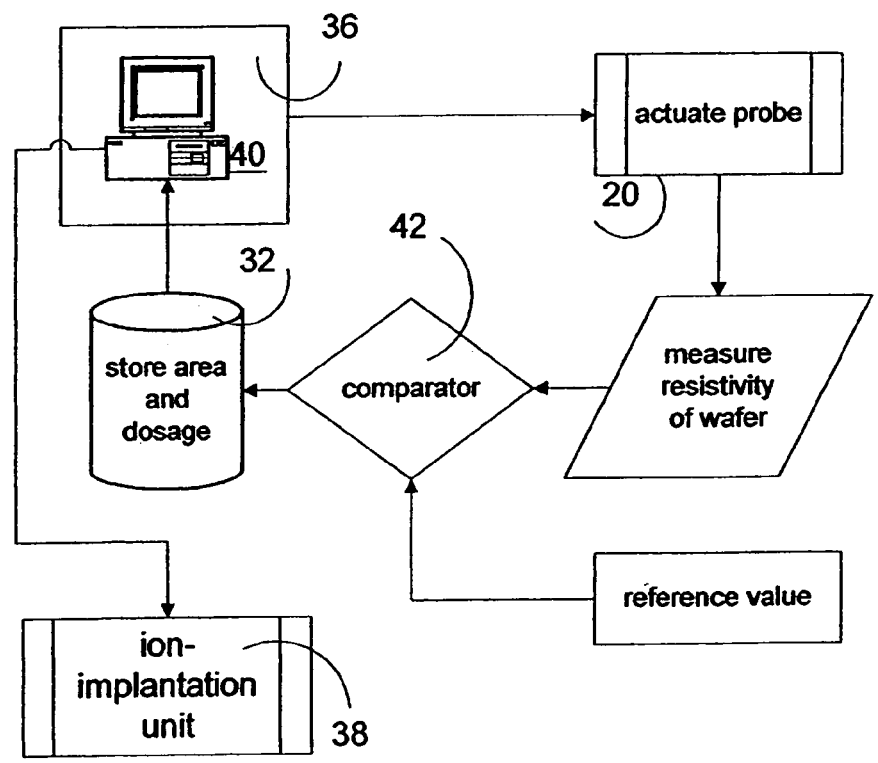
FIG. 4 is a flow chart of one embodiment of a process according to the present invention.

Referring first to FIGS. 1 and 2, wafer 10 according to prior art consists of a substrate 11 and an $N^-$ epitaxially deposited layer (epi layer) 12. Substrate 11 is typically a monocrystalline silicon body sliced from a float zone type ingot. In a typical wafer, epi layer 12 may have a thickness of 5 to 15 microns while substrate 11 may be about 375 microns thick. Wafer 10 has bottom surface 14 and top surface 15. Substrate 11 of wafer 10 may be of the highly conductive $N^{++}$ (or $P^{++}$) type having a low resistivity value of 3 milliohm centimeters. Epi layer 12, which receives junctions and device contacts typically has a much higher resistivity, for example, 0.5 ohm centimeters, the specific value depending on the desired breakdown voltage of the device.

Epi layer 12 has a constant resistivity across its width. In contrast, the resistivity of a major surface of substrate 11 varies as generally shown, for example, by FIG. 3b. The dotted line in FIG. 3b schematically shows the desired constant surface resistivity on an exaggerated scale.

In accordance with the invention, epi layer 12 is not formed on upper surface 16 of substrate 11. Rather, upper surface 16 of substrate 11 is selectively counter-doped to obtain a substantially uniform resistivity. Referring to FIG. 3a, in accordance with the present invention, upper surface 16 is mapped by sampling the surface resistivity of substrate 11 at a plurality of preselected, spaced test locations, each shown, for example, by an "X" in FIG. 3a. The resistivity is preferably determined by a non-contact probe using surface change profiler (SCP) technique to avoid damage to the silicon surface during mapping. For example, a suitable non-contact probe may be Epimet model 2DC provided by Semitest or QSC Series from QC Solutions.

Referring to FIG. 4, according to a preferred embodiment of the present invention, the resistivity of top surface 16 of substrate 11 is adjusted to attain a substantially uniform resistivity by a software which is executed by a general purpose computer. The general purpose computer as programmed by a software to execute a method according to the present invention is schematically shown by special purpose computer 36. Referring to FIG. 4, computer 36 as programmed according to the present invention first actuates a non-contact probe 20 for measuring the resistivity of a preselected area (e.g. an area marked by an X as shown in FIG. 3a) in a predetermined grid on a top surface 16 of substrate 11 (see FIG. 3a). Next, the resistivity of the preselected area is measured and compared 42 to a reference value. Based on the comparison of the resistivity value of the preselected area and the reference value computer 36 determines the amount of doping which may be required to counter-dope the selected area on the top surface 16 of substrate 11. The location of the selected area and its respective counter-doping requirement are then stored in storage facility 32. The process described above is then repeated in as many selected locations on top surface 16 of substrate 11 as needed to obtain a resistivity map and proper counter-doping requirements to obtain a substantially uniform resistivity on top surface 16 of substrate 11.

The data stored in storage facility 32 are then used to counter-dope top surface 16 of substrate 11 by ion implantation unit 38. Any suitable implant species can be used for selective counter-doping. Ion implantation unit 38 implants particular locations by scanning the implant beam, or by moving the wafer under a fixed location beam with the required dose being changed from point to point to change the resistivity. Once implantation is concluded, the implants are diffused to a desired depth in a diffusion step.

As an example of the above-disclosed method and apparatus, a 3 milliohm $cm^{-3}$ $N^{++}$ substrate can be counter-doped by a controlled boron implant beam to 0.5 ohm cm (depending on voltage rating) over its full surface and diffused to any desired depth, for example, 2 microns, or any other depth.

In accordance with a further aspect of the invention, the resistivity of the ingot, from which a substrate is obtained, can be increased during its manufacture to, for example, 10 milliohm cm. As a result, less counter-doping may be required when the resistivity of top surface 16 of substrate 11 is adjusted according to the present invention.

In the foregoing application, the invention has been described with reference to specific embodiments thereof. It, will, however be evident that various modifications and changes may be made thereto without departing from the scope of the invention as defined in the following claims.

What is claimed is:

1. A method for preparing the junction-receiving surface of a semiconductive substrate of one conductivity type which is to receive many identical devices or integrated circuits over its surface comprising:

mapping the resistivity of a major surface of a semiconductive substrate by selectively measuring the resistivity of discrete locations, said discrete locations covering all areas in a predetermined grid, said predetermined grid including an entirety of said major surface; and counter-doping said locations to increase their resistivity to a substantially uniform resistivity based on said mapping.

2. The method defined in claim 1, wherein said counter-doping step is performed by implanting ions.

3. The method defined in claim 2, further comprising diffusing said ions to a desired depth.

4. The method defined in claim 1, further comprising a step of comparing the measured resistivity of each of said discrete locations to a reference value and determining desired counter-doping for each discrete location based on said comparison.

5. The method defined in claim 1, wherein said method is executed by a software.

6. The method defined in claim 1, wherein said selective measurements are made by a non-contact probe.

7. The method defined in claim 1, wherein said semiconductive substrate is comprised of silicon.

8. The method defined in claim 1, wherein said semiconductive substrate is doped with N type dopants and counter-doped with P type dopants.

\* \* \* \* \*